(12) United States Patent
Schiller (10) Patent No.: US 6,816,301 B1
(45) Date of Patent: Nov. 9, 2004

(54) MICRO-ELECTROMECHANICAL DEVICES AND METHODS OF MANUFACTURE

(75) Inventor: Peter J. Schiller, Coon Rapids, MN (US)

(73) Assignee: Regents of the University of Minnesota, Minneapolis, MN (US)

(*) Notice: Subject to any disclaimer, the term of this patent is extended or adjusted under 35 U.S.C. 154(b) by 85 days.

(21) Appl. No.: 10/019,521

(22) PCT Filed: Jun. 29, 2000

(86) PCT No.: PCT/US00/17988

§ 371 (c)(1),
(2), (4) Date: Jun. 6, 2002

(87) PCT Pub. No.: WO01/00523

PCT Pub. Date: Jan. 4, 2001

Related U.S. Application Data
(60) Provisional application No. 60/141,413, filed on Jun. 29, 1999.

(51) Int. Cl.[7] .............................................. G02B 26/00
(52) U.S. Cl. ...................... 359/290; 359/291; 359/311; 359/295
(58) Field of Search ................................. 359/290, 291, 359/295, 302, 311; 73/720–3, 715; 216/2; 438/53

(56) References Cited

U.S. PATENT DOCUMENTS

| | | | |
|---|---|---|---|
| 4,784,721 A | 11/1988 | Holmen et al. ................ 216/2 |
| 4,996,082 A | 2/1991 | Guckel et al. ................ 427/99 |
| 5,209,119 A | 5/1993 | Polla et al. .................... 73/723 |
| 5,332,469 A | 7/1994 | Mastrangelo .................. 216/2 |
| 5,438,875 A | 8/1995 | Fung et al. .................... 73/721 |
| 5,466,932 A | 11/1995 | Young et al. ................ 250/299 |
| 5,656,778 A | 8/1997 | Roszhart .................. 73/504.04 |
| 5,672,551 A | 9/1997 | Fung ............................ 438/53 |
| 5,707,077 A | 1/1998 | Yokota et al. ............... 280/735 |
| 5,725,785 A | 3/1998 | Ishida et al. .................... 216/2 |
| 5,802,684 A | 9/1998 | Fujiu et al. ................. 29/25.35 |
| 5,831,162 A | 11/1998 | Sparks et al. ............ 73/504.12 |

FOREIGN PATENT DOCUMENTS

| | | |
|---|---|---|
| DE | 42 27 819 A1 | 2/1993 |
| EP | 2-33974 | 5/1990 |
| JP | 09 237903 A | 9/1997 |
| WO | WO 01/00523 A1 | 1/2001 |

OTHER PUBLICATIONS

Catling, "High–sensitivity silicon capacitive sensors for measuring medium–vacuum gas pressures," *Sensors and Actuators A*, 1998; 64:157–164.

French, "Development of surface micromachining techniques compatible with on–chip electronics," *J. Micromech. Microeng.*, 1996; 6:197–211.

Fung et al., "Multifunction Polysilicon Pressure Sensors for Process Control," *Sensors*, Oct. 1999; 16(10):75–79, 83.

(List continued on next page.)

*Primary Examiner*—Jordan M. Schwartz
*Assistant Examiner*—Jessica Stultz
(74) *Attorney, Agent, or Firm*—Mueting Raasch & Gebhardt, P.A.

(57) ABSTRACT

Micro-eletromechanical devices, substrate assemblies from which the devices can be manufactured, and methods to manufacture the devices are disclosed. The invention combines the advantages of conventional surface and bulk micromachining processes using a sacrificial layer to create an integrated micro-electromechanical system (MIEMS) technology that provides high performance, high yield, and manufacturing tolerance. The devices manufactured according to the present invention include, but are not limited to, pressure sensors, vibration sensors, accelerometers, gas or liquid pumps, flow sensor, resonant devices, and infrared detectors.

20 Claims, 3 Drawing Sheets

OTHER PUBLICATIONS

Kwon et al., "Three Axis Piezoresistive Accelerometer Using Polysilicon Layer," *Transducers '97*, International Conference on Solid–State Sensors and Actuators, Chicago, Ill., Jun. 16–19, 1997; 1221–1188.

Lee et al., "Piezoelectric Cantilever Microphone and Microspeaker," *J. of Microelectromechanical Systems*, Dec. 1996; 5(4):238–242.

Lemkin et al., "A 2–Axis Force Balanced Accelerometer Using a Single Proof–Mass," *Transducters '97*, International Conference on Solid–State Sensors and Actuators, Chicago, Ill., 1997; 1185–1224.

Lutz et al., "A Precision Yaw Rate Sensor in Silicon Micromachining," *Transducters '97*, International Conference on Solid–State Sensors and Actuators, Chicago Ill., 1997; 847–850.

Pedersen et al., "An integrated silicon capacitive microphone with frequency–modulated digital output," *Sensors and Actuators A*, 1998; 69:267–275.

Wolf et al., *Silicon Processing for the VLSI Era*, Sunset Beach, Calif. Lattice Press, Lattice Press, Sunset Beach, Cali., 1986, Cover Page, Publication Page, and Table of Contents only. (12 pgs.)

Yazdi et al., "An All–Silicon single–wafer fabrication technology for precision microaccelerometers," *Transducters '97*, International Conference on Solid–State Sensors and Actuators, Chicago, Ill., 1997; 1181–1184.

Yeh et al., "A Low–Voltage Tunneling–Based Silicon Microaccelerometer," *IEEE Transactions on Electron Devices*, 1997 Nov.; 44(11):1875–1882.

MICRO-ELECTROMECHANICAL DEVICES AND METHODS OF MANUFACTURE

RELATED APPLICATIONS

The present application is a national stage filing of International Patent Application No. PCT/US00/17988, filed on Jun. 29, 2000, which in turn claims the benefit of U.S. Provisional Application Ser. No. 60/141,413, filed on Jun. 29, 1999, both of which are hereby incorporated by reference in their entirety.

FIELD OF THE INVENTION

The present invention relates to the field of micro-electromechanical devices. More particularly, the present invention provides micro-electromechanical devices, substrate assemblies for forming such devices, and methods of manufacturing the substrate assemblies and devices.

BACKGROUND

Micro-electromechanical devices such as pressure sensors, actuators, etc. provide advantages in many different applications. Two basic approaches have been developed to manufacture the devices using many well-known conventional integrated circuit manufacturing techniques. The two basic approaches are typically referred to as surface mnicromachining and backside bulk micromachining.

Conventional surface-micromachining technologies do, however, have several tradeoffs. Surface micromachining typically has the advantage of superior registration since all layers are defined on the same side of the wafer using conventional planar lithographic processes. The transducer elements (piezoelectric capacitors, piezoresistive elements, etc.) can be aligned precisely to the same features that define the mechanical structure being formed. Moreover, because definition of the mechanical structure is performed with standard integrated circuit (IC) processes, the features can be transferred in a repeatable and precise manner. Good alignment of transducer elements to a high-resolution mechanical structure creates devices with high efficiency (performance) and repeatable characteristics.

Surface micromachining processes do, however, typically require encapsulation layers that are impervious to very aggressive chemicals used in forming the features on the front surface of the devices. By definition, surface-micromachining exposes the surface of the wafer to a variety of etchants and other removal processes. For example, in the case of sacrificial phosphosilicate glass (PSG) layers, the encapsulation layer may need to protect all vulnerable layers from highly-concentrated hydrofluoric acid (HF) liquid or vapor. In the case of sacrificial polysilicon and/or silicon layers, the encapsulation layer may need to protect all other materials from a heated potassium-hydroxide (KOH) or tetramethyl-ammonium-hydroxide (TMAH) solution.

Regardless, the encapsulation layer typically adds to the bulk of the devices and may also affect performance by, for example, increasing the stiffness of a diaphragm used in a pressure sensor or actuator. That additional stiffness may reduce sensitivity (in the case of, e.g., a sensor) and/or it may increase the power requirements for operating an actuator. To address these issues, it may be desirable to reduce the thickness of an encapsulation layer. Reducing the encapsulation layer thickness, however, increases the likelihood that the underlying features on the device will not be adequately protected, thereby reducing product yield. As a result, surface micromachined device performance is often limited by availability of a thin film technology suitable for encapsulation layers.

Conventional backside bulk-micromachining techniques also have tradeoffs. The essence of backside silicon micromachining separates the machining operation from the fine-featured frontside. However, this same characteristic also leads to the limitations of backside bulk-micromachining. When the machining proceeds from the backside, front-to-backside alignment defines the registration between the mechanical structure and the transducer elements. Generally, the overlay capabilities are coarse and performance is lost.

Perhaps even more significant, the silicon etch proceeding from the backside will reach the front side at a position dependent on the wafer thickness and/or etch profile distribution. For potassium hydroxide (KOH) etching with anisotropic sidewall angle consistently near 53°, each 50 $\mu$m variation in wafer thickness will result in about 30 $\mu$m variation in the finished position of the mechanical feature at the front. In the case of Deep Reactive Ion Etching (DRIE), the etch profile varies with feature size and wafer position so that variations in finished dimensions can also be on the order of tens or even hundreds of microns within a single wafer. Combining alignment errors and etch profile variations, bulk machining techniques often lead to large discrepancies between the frontside-defined transducer elements and the mechanical structure.

SUMMARY OF THE INVENTION

The present invention provides micro-electromechanical devices, substrate assemblies from which the devices can be manufactured, and methods to manufacture the devices. The invention combines the advantages of conventional surface and bulk micromachining processes to create an integrated micro-electromechanical system (MEMS) technology that provides high performance, high yield, and manufacturing tolerance. The devices manufactured according to the present invention include, but are not limited to, pressure sensors, vibration sensors, accelerometers, gas or liquid pumps, flow sensors, resonant devices, and infrared detectors.

One advantage of the present invention is that the mechanical integrity of the substrates on which the devices are formed is maintained until the last processing steps. By maintaining the mechanical integrity of the substrate while all of the front side processing is performed accuracy in the alignment of the various structures on the device can be improved as compared to known methods of manufacturing such devices. As discussed above, in methods in which voids are formed in the substrate before all of the front side processing is complete (including metallic contacts), alignment and yield can suffer due to the reduced mechanical integrity of the underlying substrate.

Another potential advantage of the present invention is that the fatigue resistance of the devices may be improved by maintaining an included angle of less than 90 degrees between the diaphragm layer and the substrate in the devices.

Because this invention relates to methods of fabrication that could be applied to a wide variety of micro-fabricated sensor and/or actuator devices, the scope of application is very wide. Nonlimiting examples of applications in which vibration sensors or accelerometers of the present invention may be used include navigational systems (automotive, aeronautic, personal, etc.); environmental monitors (seismic activity, traffic monitors, etc.); equipment monitors (industrial equipment, etc.); component monitors (fatigue/crack detection, shock threshold detection, etc.); and biomedical monitors (cardiac monitor, activity monitor, ultrasonic-GPS, etc.).

Nonlimiting examples of applications in which pressure sensors of the present invention may be used include aeronautics (altimeter, air velocity, etc.); combustion engine applications (combustion diagnostic, exhaust monitor, fuel monitor; etc.); and auditory applications (hearing aids, minimicrophones, etc.).

Nonlimiting examples of applications in which resonant structures of the present invention may be used include chemical sensing (electronic nose, military, biomedical, etc.) and environmental monitors (humidity, biohazard detection, pressure, etc.).

Nonlimiting examples of applications in which pumps of the present invention may be used include miniature vacuum systems (mass spectrometry, medical diagnostics, etc.); drug delivery (implanted drug delivery, precision external delivery, etc.); microfluidics (DNA chips, medical diagnostics, etc.); and sample extraction (environmental, biomedical, etc.).

In one aspect, the present invention provides a method of manufacturing a micro-electromechanical device having front and back sides, the method including providing a substrate having a first side located proximate the front side of the device and second side proximate the back side of the device; providing sacrificial material on a selected area of the first side of the substrate; providing a diaphragm layer on the sacrificial material and the first side of the substrate surrounding the sacrificial material in the selected area; providing at least one transducer on the front side of the device, the transducer located over the sacrificial material, wherein the transducer includes transducing material and electrical contacts in electrical communication with the transducing material; forming a void in the substrate from the second side of the substrate towards the first side of the substrate after providing the transducer on the front side of the device, wherein at least a portion of the sacrificial material is exposed within the void proximate the first side of the substrate; and removing at least a portion of the sacrificial material through the void, wherein a portion of the diaphragm layer is suspended directly above the substrate within the selected area.

In another aspect, the present invention provides a substrate assembly having front and back sides, the assembly including a substrate having a first side located proximate the front side of the device and second side proximate the back side of the substrate assembly; sacrificial material on the first side of the substrate in a plurality of selected areas; a diaphragm layer covering the sacrificial material in the selected areas, the diaphragm layer extending to cover the first side of the substrate surrounding the sacrificial material in the selected areas; a plurality of transducers on the front side of the device, each of the transducers located over at least a portion of each of the selected areas, wherein the transducer includes transducing material and electrical contacts in electrical communication with the transducing material; wherein the sacrificial material in the selected areas is encapsulated between the substrate and the diaphragm layer. This substrate assembly can then be separated into a plurality of MEMS devices, each device including at least one of the transducers.

In another aspect, the present invention provides a micro-electromechanical device having front and back sides, the device including a substrate having a first side located proximate the front side of the device and second side proximate the back side of the device; a void formed through the first and second sides of the substrate, the void including an opening proximate the first side of the substrate; and a diaphragm layer spanning the opening in the first side of the substrate and attached to the first side of the substrate, wherein a portion of the diaphragm layer is suspended directly above a portion of the substrate surrounding the opening of the void; and wherein the suspended portion of the diaphragm layer and the substrate form an included angle at their junction of less than 90 degrees.

These and other features and advantages of the invention are described more completely with respect to various illustrative embodiments below.

DETAILED DESCRIPTION OF ILLUSTRATIVE EMBODIMENTS OF THE INVENTION

Illustrative methods and devices according to the present invention will now be described with reference to the drawings. In general, however, the integration of frontside and backside processing technologies may provide a) high performance, b) repeatability, c) high yield, d) wide process margins, and e) ease of integration.

Although the various methods and devices are described singly, it will be understood that the methods of the present invention will typically involve the simultaneous production of a number of the devices on a single integral substrate assembly using integrated circuit manufacturing techniques. A variety of integrated circuit manufacturing techniques are described in, e.g., S. Wolf and R. Tauber, *Silicon Processing for the VLSI Era*, (Sunset Beach, Calif., Lattice Press, 1986). The end result, after separation of the devices formed on each substrate, may be discrete sensors and/or actuators, but the process will be used to manufacture multiple devices at the same time.

One illustrative method according to the present invention will now be described with reference to FIGS. 1A–1D in which the formation of a circular vibration sensor is described. The completed vibration sensor is generally circular in shape, although the figures illustrate its construction in cross-section. The vibration sensor relies on piezoelectric capacitors to convert mechanical strain to an electrical signal by virtue of the primary piezoelectric effect.

Figure 1A:
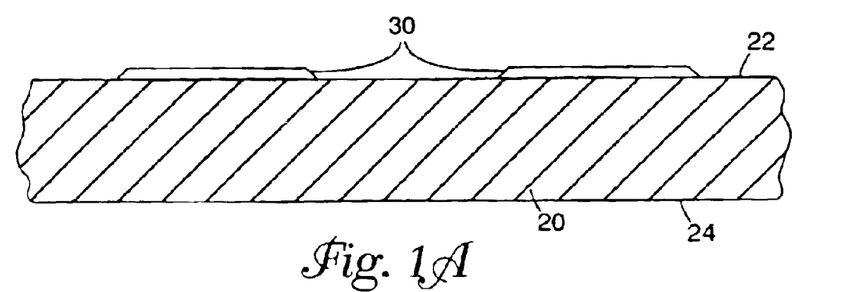
FIGS. 1A–1D illustrate one process of forming a vibration sensor according to the present invention.

The method includes the use of a substrate 20 having a front surface 22 and a back surface 24. It will typically be preferred that the substrate 20 be manufactured of materials amenable to processing (e.g., etching) used in the production of integrated circuit devices. Examples of some suitable materials for the substrate 20 include, e.g., silicon wafers and similar structures. It may also be preferred that one or both of the surfaces 22 and 24 of the substrate 20 be planar to facilitate high resolution processing.

Sacrificial material 30 is then provided in selected areas on the front surface 22 of the substrate 20. The thickness of the sacrificial material 30 in the selected areas may preferably be about 0.5 to about 1 micrometer. The control over the selected areas in which the sacrificial material 30 is deposited may be accomplished, e.g., by using patterned photoresist material followed by deposition of the patterned material in the selected areas where the photoresist has been removed. Alternatively, the sacrificial material 30 may be deposited over substantially all of the front surface 22, followed by patterning and removal of the sacrificial material, leaving the sacrificial material 30 in only the selected areas as illustrated in FIG. 1A. Such techniques are well known and will not be described further herein.

The sacrificial material 30 is preferably selectively removable with respect to the underlying substrate 20. Where etching is to be used to form voids through the substrate 20 from the back surface 24 towards the front surface 22, it may be preferred that the sacrificial material act as an etch stop to halt etching when the void being formed reaches the underside of the sacrificial material 30.

Another characteristic that may be exhibited by preferred sacrificial material 30 is reflowability. In other words, after any patterning material (e.g., photoresist) is removed from around the selected areas in which the sacrificial material 30 has been deposited, it may be desirable that the sacrificial material 30 be reflowed to provide desirable smooth edges to the sacrificial material 30 in the selected areas. One nonlimiting example of a suitable reflowable sacrificial material 30 is phosphosilicate glass (PSG).

Other potential materials for the sacrificial material include heavily doped n+ silicon or polysilicon layers. N-type doping levels near the solid solubility limit accentuate the lateral etch rate in a variety of wet chemical and dry plasma etchants. Wet chemical etchants commonly used to selectively etch n+ silicon or polysilicon include but are not limited to a) KOH, b) TMAH, and c) HF/HNO$_3$. Dry plasma etch agents commonly used to rapidly etch n+ silicon and polysilicon include but are not limited to a) C12, b) SF6, and c) other Cl- or F-containing gases. Other materials/etchants have been reported in the literature and may be appropriate for some applications within the method described here.

Figure 1B:
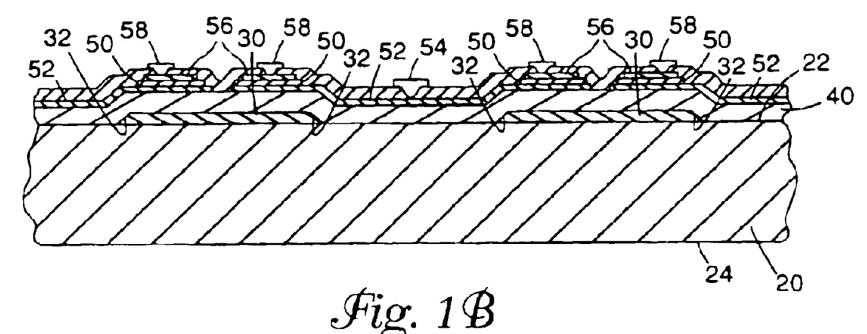

Referring now to FIG. 1B, with the sacrificial material 30 in locating in the selected areas on the front surface 22 of the substrate 20, a diaphragm layer 40 is deposited over the sacrificial material 30 and on the front substrate surface 22 surrounding the selected areas. The diaphragm layer 40 functions as a mechanical support layer over the sacrificial material 30 (which will be removed later) for the transducer to be formed over the selected areas of sacrificial material 30. The diaphragm layer 40 may have any suitable thickness depending on the size of the selected areas of sacrificial material 30, the size of the transducer to be formed on the diaphragm layer 40, and other factors.

Suitable materials for the diaphragm layer 40 will exhibit sufficient mechanical strength to support the transducer structures to be deposited on it (after removal of the underlying sacrificial material 30) and the ability to flex during the sensing or actuating processes performed by the device. The diaphragm layer 40 is also preferably formed of materials that are not electrically conductive. Examples of suitable materials include silicon nitride, silicon dioxide, etc. One preferred material may be a low-stress silicon nitride diaphragm layer 40 deposited at a thickness of about 2.0 micrometers.

After the diaphragm layer 40 is completed, other structures required for the desired transducer can be formed on the diaphragm layer 40. In the illustrated embodiment, conductive electrode layers 52 are provided in selected areas on the diaphragm layer 40. The conductive electrode layers 52 may be provided by any suitable electrically conductive material that can be provided in the desired patterns on the diaphragm layer 40. One example of a suitable material for the conductive electrode layers 52 is doped polycrystalline silicon.

The electrode layer 52 may preferably form the lower electrodes for connection to, e.g., the transducer elements 50 provided over the selected areas containing the sacrificial material 30 (encapsulated between the diaphragm layer 40 and the substrate 20). The transducer elements 50 may be formed of any suitable transducing material. For the purposes of the present invention, "transducing element" is any structure that exhibits a change in one or more measurable electrical properties when subjected to mechanical strain or which exhibits a mechanical force when subjected to an applied electrical stimulus. Examples of transducing elements 50 may include layers of piezoelectric material, piezoresistive materials, electrically conductive materials, optically active materials (e.g., materials that exhibit some change in optical properties in response to strain, e.g., a change in transmissivity, absorbance, birefringence, etc.), magnetostrictive materials, magnetoresistive materials, etc.

After formation of the transducer elements 50, an upper electrode layer 56 is formed in electrical communication with the transducing element 50, such that the transducing element 50 is in electrical communication with both the lower electrode layer 52 and the upper electrode layer 56. The upper electrode layer 56 is manufactured in a manner and using materials that are similar to those used for the lower electrode layer 52. In the case of PZT transducer elements, a piezoelectric capacitor is formed that converts mechanical strain in the diaphragm layer 40 to an electrical signal by virtue of the primary piezoelectric effect.

In addition to the transducer element 50 and associated conductive electrode layers 52 and 56, the structures provided on the diaphragm layer 40 also include contacts 54 and 58 that are in electrical communication with the lower electrode layer 52 and upper electrode layer 56, respectively. The contact 54 in electrical communication with the lower electrode layer 52 may be used to supply, e.g., ground voltage to the transducer element 50 through the lower electrode layer 52.

The electrical contacts 54 and 58 may preferably be formed of a metal or metals to facilitate connection of the transducer element 50 to other devices. Suitable metals used for the contacts 54 and 58 include any patternable metal or combination of metals used in integrated circuit manufacturing. Examples include, but are not limited to, aluminum, titanium, gold, platinum, tungsten, copper, etc.

Figure 1C:
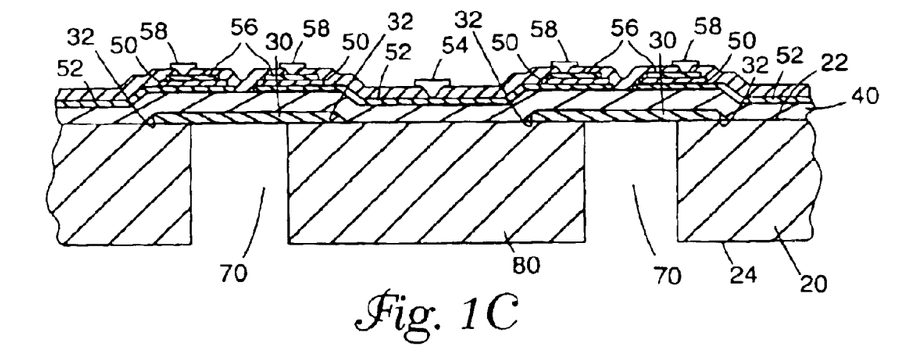

FIG. 1B thus illustrates one substrate assembly from which a plurality of micro-electromechanical devices can be manufactured. Referring now to FIG. 1C, with the structures on the front side of the substrate assembly completed, the voids 70 required to form the desired vibration sensor can be formed from the back surface 24 of the substrate 20. In one embodiment, the back surface 24 of the substrate 20 is patterned and etched using any suitable integrated circuit manufacturing technique or techniques. It may be desirable that the techniques used be selective to the material of the substrate 20 as opposed to the sacrificial material 30 located in the selected areas on the front surface 22 of the substrate.

In the case of a silicon substrate, it may be preferred to use a Deep Reactive Ion Etching (DRIE) process (e.g., an SF$_6$-based Bosch process) to form void 70 in the substrate 20. The etching preferably terminates at the underside of the sacrificial material 30 as illustrated in FIG. 1C. The void 70 is provided in the shape of an annular ring (when viewed from above or below) that also defines the shape of a proof mass 80 located within the void 70 and attached to the diaphragm layer 40 within the area defined by the transducing elements 50. The proof mass 80 is, as a result, a separated portion of the original substrate 20. Other methods may also be used to form the void 70, although one advantage of DRIE is that the sidewalls of the void may be more orthogonal with respect to the back surface 24 of the substrate 20 as compared to other etching processes.

Other techniques may alternatively be used to form void 70. For example, chlorinated gas species are often used for etching silicon and polysilicon. Also, plasma etching is not the only available method for etching through the silicon wafer. Wet chemical agents such as KOH and TMAH are often used in bulk-micromachining process modules to etch from one side of a silicon wafer to the other. While such wet chemicals do not provide the same near-vertical etch profile, they may be substituted if DRIE technology is not available.

Figure 1D:
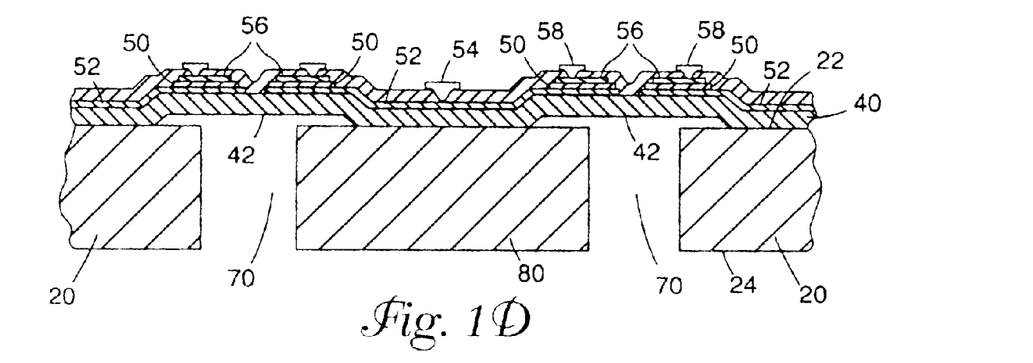

After formation of the void 70 in the substrate 20, the sacrificial material 30 in the selected areas can be removed to suspend a portion of the diaphragm layer 40 directly above the substrate 20 within the selected area previously occupied by the sacrificial material as illustrated in FIG. 1D. Removal of the sacrificial material 30 may preferably be accomplished by exposing only the back substrate surface 24 to gas phase hydrofluoric acid (HF) which selectively removes the preferred PSG sacrificial material 30 as opposed to the silicon substrate 20 and the preferred silicon nitride diaphragm layer 40.

In the preferred methods, the void 70 is formed and the sacrificial material 30 is removed without exposing the front of the device (with the contacts 54 and 58 and any other features) to the etchants or other materials used to form either the void 70 or remove the sacrificial material 30. In other words, the removal can be performed by only exposing the back surface 24 of the substrate 20. No elaborate encapsulation is required for the front side of the device.

The vibration sensor thus formed as seen in cross-section in FIG. 1D includes a diaphragm layer 40, a portion of which is suspended directly above the substrate 20 surrounding the void 70. The junction between the diaphragm layer 40 and the substrate 20 can be subject to fatigue as the sensor is used an the diaphragm layer 40 flexes. It may be desirable that the included angle formed between the front surface 22 of the substrate 20 and the underside 42 of the diaphragm layer 40 be less than 90 degrees to improve fatigue resistance of the sensor.

It is in this area where the use of reflowable sacrificial material 30 may be beneficial. Reflowing the sacrificial material 30 after removing the patterning material can be used to provide sloping edges 32 on the sacrificial material 30. Those sloped edges 32 can provide the desired included angle of less than 90 degrees at the junction of the diaphragm layer 40 and the substrate 20. It may be even more preferred that the included angle at the junction between the diaphragm layer 40 and the substrate 20 be about 75 degrees or less.

Likewise, the included angle formed at the junction of the diaphragm layer 40 and the proof mass 80 is also preferably less than 90 degrees, possibly even more preferably about 75 degrees or less, to improve fatigue resistance there as well.

It is also desirable when manufacturing devices according to the methods of the invention, to provide the void 70 and remove the sacrificial material 30 as the last processing steps. By so doing, the mechanical integrity of the substrate 20 can be maintained while all of the front side processing is performed, thereby improving accuracy in the alignment of the various structures on the device. In methods in which voids are formed in the substrate before all of the front side processing is complete, alignment and yield can suffer due to the reduced mechanical integrity of the underlying substrate.

Figure 2:
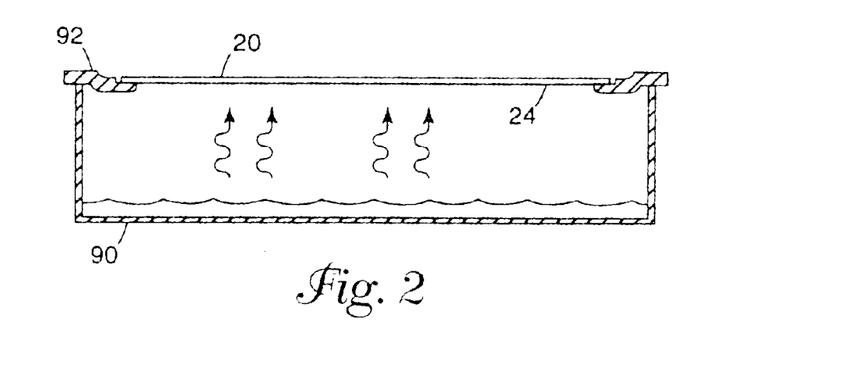
FIG. 2 is a schematic diagram of one etching apparatus that may be used in connection with the present invention.

FIG. 2 demonstrates one apparatus suitable for performing gas phase etching in a technique that exposes only the back surface 24 of the substrate 20 and the exposed undersides of the sacrificial material 30 to the etchant. A container 90 is provided that contains, e.g., a liquid etchant (such as liquid-phase HF). The substrate 20 is placed over the top 92 of the container 90 and sealed around its edges to expose only the back surface 24 of the substrate 20 to the etchant. Where gas phase etching is desired, gaseous etchant may be trapped within the sealed container 90. In the case of HF etching, the HF vapor within the container 90 will typically reach an equilibrium concentration sufficient to rapidly etch the exposed PSG sacrificial material 30 exposed through the voids 70.

To further protect the features on the front of the device, it may be desirable to flow, e.g., an inert gas (such as nitrogen, argon, or just air) over the front surface during etching to minimize exposure to trace levels of HF or any other etchant escaping from the container 90. In another variation, it may be desirable to heat the device on the container 90 (using, e.g., an infrared lamp) to heat the wafer, thereby increasing the reaction rate of the etchant with the sacrificial material and promote the evaporation of reaction byproducts.

Although not mentioned in the prior discussion, another advantage of this apparatus and method is "dry release". With a dry release process the mechanical structure is, in part, separated from the substrate by a method that does not involve wet chemical etching. Mechanical stresses applied to the freed structure are then only the result of low-viscosity air flow or molecular bombardment. By contrast, a "wet release" process requires immersion in a liquid solution typically following by several aqueous rinse cycles. During the liquid-phase process steps, high surface tension and/or high-viscosity fluid flow often damage the thin film mechanical structure or lead to stiction-related yield loss.

The embodiment and methods described with respect to FIGS. 1A–1D provide a vibration sensor using piezoelectric capacitors to convert mechanical strain in the membrane to an electrical signal by virtue of the primary piezoelectric effect. The converse piezoelectric describes deformation (strain) of a piezoelectric material in response to an applied electric field or signal. That effect may be exploited in actuator-type devices such as resonators, pumps, valves, etc. wherein mechanical motion is the result of applied electrical energy.

A second material class embodiment substitutes piezoresistive elements for the piezoelectric capacitor. Piezoresistive materials demonstrate a change of electrical resistance in response to an applied mechanical stress or strain. Common piezoresistive materials include but are not limited to a) thin film polycrystalline silicon of p- or n-type conductivity, b) single crystal silicon of p- or n-type conductivity, and c) various metallic materials such as platinum, gold, aluminum, etc.

A third embodiment for mechanical-to-electrical energy conversion involves electrostatics, most often in the form of capacitive sensors. When the physical separation of two electrical conductors is changed, the capacitance changes. Conductive layers in a device can be arranged such that the mechanical strain or displacement changes the capacitance, a property readily detected with conventional electronics. Conversely, electrostatics can be employed to create mechanical motion from electrical energy in much the same manner.

In yet another variation, magnetostrictive or magnetoresistive materials may be used to convert between mechanical energy and electrical energy.

Figure 3A:
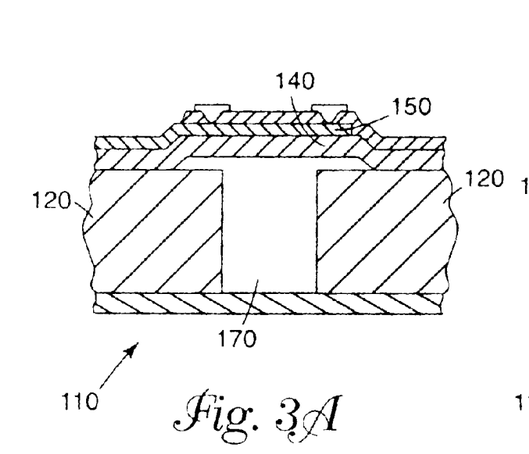
FIGS. 3A & 3B are cross-sectional and plan views, respectively, of a pressure sensor.
Figure 3B:
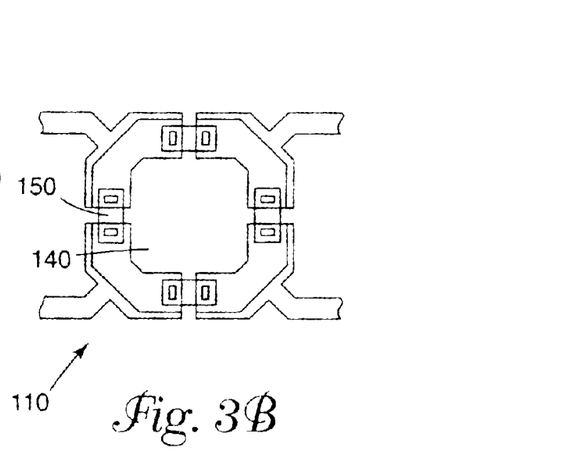

FIGS. 3A and 3B depict a piezoresistive pressure sensor 110 manufactured according to the present invention. The pressure sensor 110 includes a diaphragm layer 140 that spans a void 170 formed in substrate 120. The void 170 may optionally be sealed on the side of the substrate 120 opposite the diaphragm layer 140 by any suitable sealing mechanism, e.g., a layer of bonded glass, silicon, etc.

The sensor 110 includes piezoresistive transducer elements 150 that change resistivity in response to mechanical strain in the diaphragm layer 140 caused by pressure changes relative to the pressure within the void 170. The extent of any deflection is dependent on the magnitude of the pressure differential on both sides of the diaphragm layer 140. The pressure-dependent stress in the diaphragm layer 140 changes the electrical resistance of the transducer elements 150, a property that is easily measured with simple electronics. Fabrication of the pressure-sensing device 110 proceeds as described in FIGS. 1A–1D with the following exceptions; a) piezoresistive elements are used instead of piezoelectric capacitors, and b) the shape of the void 170 is such that no proof mass is retained, c) the vibration sensor requires no silicon or glass wafer to seal the void 170.

Figure 4A:
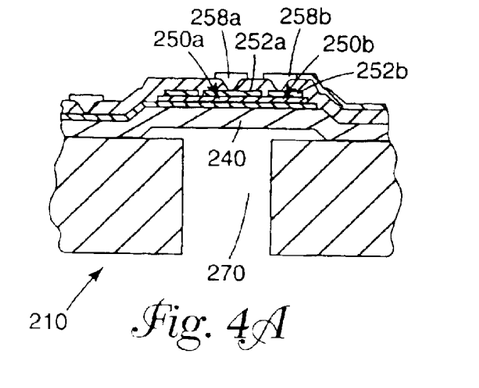
FIGS. 4A & 4B are cross-sectional and plan views, respectively, of a resonant device.
Figure 4B:
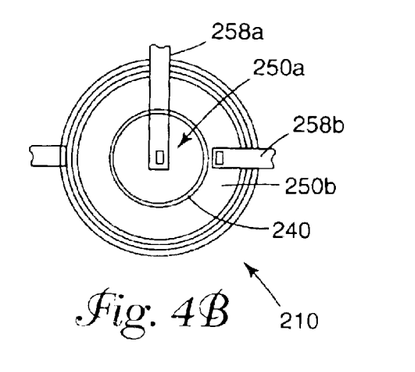

FIGS. 4A and 4B depict a cross-sectional and a top view of a piezoelectric resonant device 210 also manufactured according to the present invention. The device 210 includes a diaphragm layer 240 that can be driven into mechanical oscillation by, e.g., applying an electric signal to a central circular piezoelectric capacitor 250a (defined by the upper electrically conductive layer 252a). The outer donut piezoelectric capacitor 250b (defined by the upper electrically conductive layer 252b) can act as a sensor whereby the output voltage is dependent on deflection of the diaphragm layer 240. The voltages can be applied to the different capacitors 250a and 250b using electrical contacts 258a and 258b.

The central and outer capacitors 250a and 250b can be operated as an actuator and a sensor pair coupled by the mechanical diaphragm layer 240 to provide the elements needed for a resonant feedback loop. The conductive layers 252a and 252b are preferably configured to efficiently excite the fundamental vibration mode of the diaphragm layer 240 suspended over the void 270. In use, an appropriate signal amplifier would be placed in communication with the capacitors such that the electrical signature on the sensing element is amplified and applied to the actuating element.

Fabrication of this resonant device 210 proceeds as described in FIGS. 1A–1D except the void 270 is arranged such that no proof mass is retained.

Figure 5A:
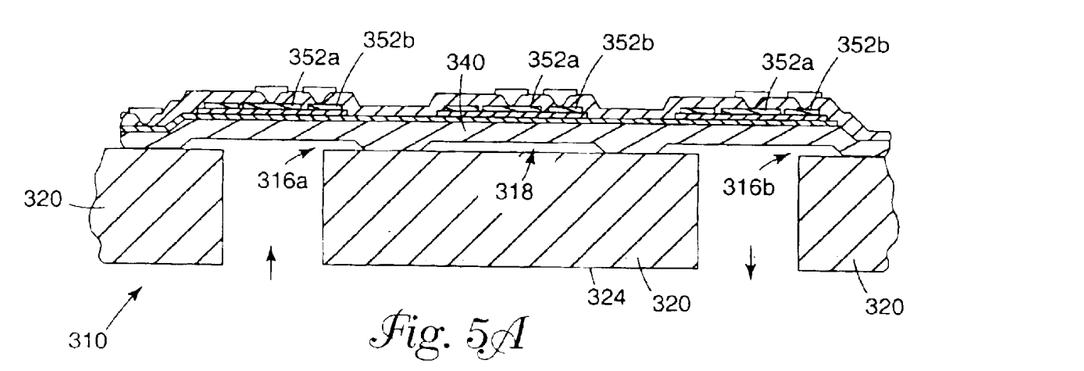
FIGS. 5A & 5B are cross-sectional and plan views, respectively, of a pump device.
Figure 5B:
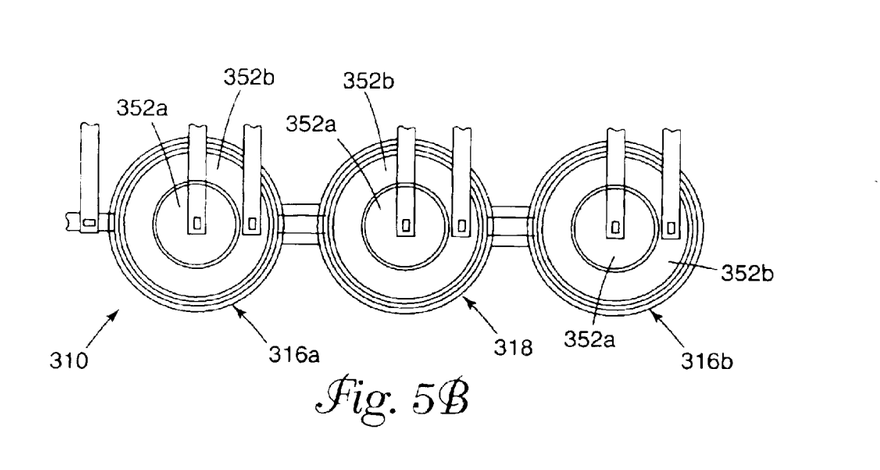

FIGS. 5A and 5B depict a cross-sectional and a top view of a piezoelectric gas and/or liquid pump that can be manufactured according to the present invention. A similar arrangement of the chambers and connecting channels may be found in, e.g., U.S. Pat. No. 5,466,932 (Young et al.), although the construction differs according to the methods of the present invention. The pump 310 can be manufactured using sacrificial material in selected areas as described above to suspend portions of the diaphragm layer 340 above the substrate 320. The pump consists of two valves 316a and 316b on either side of a differential volume chamber 318. The electrode configuration for the valves 316a/316b and chamber 318 are similar to those used in connection with the circular resonant device of FIGS. 4A and 4B. All lower electrodes are preferably connected to ground.

The various portions of the diaphragm layer 340 can be actuated by simultaneously applying opposite polarity voltage levels to the inner and outer upper electrodes 352a and 352b. For instance, the diaphragm layer above the chamber 318 can be depressed or moved toward the substrate 320 by applying a voltage other than ground to the central electrode 352a and voltage of the opposite polarity to the outer electrode 352b. Similarly, valves 316a and 316b can be actuated by applying voltages to their respective central and outer electrodes.

As an integrated device, the pump 310 operates by flowing liquid or gas from one flow channel to the other. Appropriate plumbing ports would preferably be made at the back surface 324 of the substrate 320.

Fluid pumping may be accomplished by opening the inlet valve 316a, forcing the diaphragm layer 340 in the chamber 318 up (away from the substrate 320), and closing the outlet valve 316b. Once these conditions have been established, pumping can begin by closing the inlet valve 316a, opening outlet valve 316b and reducing the volume of chamber 318. With the volume of chamber 318 reduced, the outlet valve 316b is closed and inlet valve 316a is opened. Increasing the volume of the chamber 318 then draws fluid into the chamber 318. With fluid in the chamber 318, the inlet valve 316a can be closed and outlet valve 316b opened, followed by reducing the volume of chamber 318 to force the fluid therein to exit through open outlet valve 316b. Outlet valve 316b can then be closed, followed by opening of inlet valve 316a and expansion of chamber 318 to draw more fluid into the chamber 318. The cycle then continues until the desired amount of fluid has been pumped. The efficiency of the valves might be enhanced by incorporating an electrostatic clamping mechanism.

The preceding specific embodiments are illustrative of the practice of the invention. This invention may be suitably practiced in the absence of any element or item not specifically described in this document. The complete disclosures of all patents, patent applications, and publications are incorporated into this document by reference as if individually incorporated in total.

Various modifications and alterations of this invention will become apparent to those skilled in the art without departing from the scope of this invention, and it should be understood that this invention is not to be unduly limited to illustrative embodiments set forth herein, but is to be controlled by the limitations set forth in the claims and any equivalents to those limitations.

What is claimed is:

1. A method of manufacturing a micro-electromechanical device having front and back sides, the method comprising:

providing a substrate comprising a first side located proximate the front side of the device and second side proximate the back side of the device;

providing sacrificial material on a selected area of the first side of the substrate, wherein the sacrificial material is reflowable;

providing a diaphragm layer on the sacrificial material and the first side of the substrate surrounding the sacrificial material in the selected area;

providing at least one transducer on the front side of the device, the transducer located over the sacrificial material, wherein the transducer comprises transducing material and electrical contacts in electrical communication with the transducing material;

forming a void in the substrate from the second side of the substrate towards the first side of the substrate after providing the transducer on the front side of the device, wherein at least a portion of the sacrificial material is exposed within the void proximate the first side of the substrate; and removing at least a portion of the sacrificial material through the void, wherein a portion of the diaphragm layer is suspended directly above the substrate within the selected area;

wherein the method further comprises reflowing the sacrificial material.

2. A method according to claim 1, wherein the suspended portion of the diaphragm layer and the substrate form an included angle at their junction of less than 90 degrees.

3. A method according to claim 1, wherein the void is formed by etching through the substrate while the electrical contacts are exposed on the front side of the device.

4. A method according to claim 1, wherein the electrical contacts are metallic, and wherein the void is formed by etching through the substrate while the metallic electrical contacts are exposed on the front side of the device.

5. A method according to claim 1, wherein removing the sacrificial material comprises selectively etching the sacrificial material.

6. A method according to claim 5, wherein removing the sacrificial material comprises selectively etching the sacrificial material by exposing only the back side of the device to an etchant.

7. A method according to claim 6, wherein the etchant is in a gas phase.

8. A method according to claim 1, wherein providing the sacrificial material comprises depositing a layer of the sacrificial material on the first side of the substrate in the selected area.

9. A method according to claim 8, wherein the first side of the substrate is planar.

10. A method according to claim 1, wherein the void comprises an opening within the selected area on the first side of the substrate that is smaller than the selected area occupied by the sacrificial material.

11. A method according to claim 1, wherein forming the void in the substrate further comprises forming a proof mass attached to the diaphragm layer, the proof mass comprising a portion of the substrate that is separated therefrom.

12. A method according to claim 11, wherein the void is in the shape of an annular ring and the proof mass is cylindrical.

13. A method according to claim 11, wherein the suspended portion of the diaphragm layer and the proof mass form an included angle at their junction of less than 90 degrees.

14. A substrate assembly having front and back sides, the assembly comprising:

a substrate comprising a first side located proximate the front side of the device and second side proximate the back side of the substrate assembly;

sacrificial material on the first side of the substrate in a plurality of selected areas, wherein the sacrificial material comprises reflowed sacrificial material;

a diaphragm layer covering the sacrificial material in the selected are the diaphragm layer extending to cover the first side of the substrate surrounding the sacrificial material in the selected areas;

a plurality of transducers on the front side of the device, each of the transducers located over at least a portion of each of the selected areas, wherein the transducer comprises transducing material and electrical contacts in electrical communication with the transducing material;

wherein the sacrificial material in the selected areas is encapsulated between the substrate and the diaphragm layer.

15. An assembly according to claim 14, wherein the diaphragm layer and the substrate form an included angle at edges of the sacrificial material in the selected areas of less than 90 degrees.

16. An assembly according to claim 14, wherein the electrical contacts are metallic.

17. An assembly according to claim 14, wherein the sacrificial material is selectively removable with respect to the diaphragm layer and the substrate.

18. An assembly according to claim 14, wherein the sacrificial material comprises a layer deposited on the first side of the substrate in the selected areas.

19. An assembly according to claim 14, wherein the first side of the substrate is planar.

20. An assembly according to claim 14, wherein the sacrificial material comprises glass.

\* \* \* \* \*

UNITED STATES PATENT AND TRADEMARK OFFICE
CERTIFICATE OF CORRECTION

PATENT NO. : 6,816,301 B1
DATED : November 9, 2004
INVENTOR(S) : Peter J. Schiller

It is certified that error appears in the above-identified patent and that said Letters Patent is hereby corrected as shown below:

Title page,
Item [57], ABSTRACT, delete "(MIEMS)" and insert -- (MEMS) --

Column 12,
Line 19, delete "are" and insert -- areas, --

Signed and Sealed this

Fifteenth Day of February, 2005

JON W. DUDAS
*Director of the United States Patent and Trademark Office*